United States Patent
Steinmacher-Burow

(10) Patent No.: US 9,547,611 B2
(45) Date of Patent: Jan. 17, 2017

(54) COMPUTER SYSTEM WITH GROUPS OF PROCESSOR BOARDS

(71) Applicant: International Business Machines Corporation, Armonk, NY (US)

(72) Inventor: Burkhard Steinmacher-Burow, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 11 days.

(21) Appl. No.: 14/602,439

(22) Filed: Jan. 22, 2015

(65) Prior Publication Data

US 2015/0223337 A1    Aug. 6, 2015

(30) Foreign Application Priority Data

Jan. 31, 2014    (GB) .................................... 1401654.7

(51) Int. Cl.
*H05K 1/00* (2006.01)
*G06F 13/38* (2006.01)
(Continued)

(52) U.S. Cl.
CPC .......... *G06F 13/382* (2013.01); *G06F 13/1663* (2013.01); *G06F 13/4221* (2013.01); *H05K 1/144* (2013.01); *H05K 1/181* (2013.01); *H05K 3/366* (2013.01); *H05K 7/1444* (2013.01); *H05K 7/1445* (2013.01); *H05K 2201/042* (2013.01); *H05K 2201/10159* (2013.01)

(58) Field of Classification Search
USPC ............................... 361/748, 679.31, 679.02
See application file for complete search history.

(56) References Cited

U.S. PATENT DOCUMENTS

| 5,211,565 A | 5/1993 | Krajewski et al. |
| 2004/0023558 A1 | 2/2004 | Fowler et al. |

(Continued)

FOREIGN PATENT DOCUMENTS

| EP | 0336243 A2 | 3/1989 |
| EP | 0336243 A2 | 10/1989 |

(Continued)

OTHER PUBLICATIONS

Burkhard Steinmacher-Burow, "Computer System With Groups of Processor Boards," U.S. Appl. No. 14/748,267, filed Jun. 24, 2015.
(Continued)

*Primary Examiner* — Andargie M Aychillhum
(74) *Attorney, Agent, or Firm* — Cantor Colburn LLP; Keivan Razavi

(57) ABSTRACT

A computer system includes a plurality of printed circuit boards, each printed circuit board having one or more processor chips attached to the printed circuit board, wherein the number of printed circuit boards is an even number greater than or equal to 4, wherein the printed circuit boards are arranged in two groups, each group being arranged in a different stacking direction, and wherein the one or more processor chips which are attached to each one of the printed circuit boards of one of the groups are connected for communication to the processor chips of each printed circuit board of the other group.

13 Claims, 14 Drawing Sheets

(51) Int. Cl.
*H05K 1/18* (2006.01)
*G06F 13/42* (2006.01)
*G06F 13/16* (2006.01)
*H05K 1/14* (2006.01)
*H05K 3/36* (2006.01)
*H05K 7/14* (2006.01)

(56) References Cited

U.S. PATENT DOCUMENTS

| | | | |
|---|---|---|---|
| 2005/0207134 A1* | 9/2005 | Belady | H05K 1/14 361/796 |
| 2013/0107853 A1 | 5/2013 | Pettus et al. | |
| 2013/0205090 A1 | 8/2013 | Lee | |

FOREIGN PATENT DOCUMENTS

| | | |
|---|---|---|
| EP | 2651054 A1 | 10/2013 |
| GB | 2251730 A | 7/1992 |
| JP | H09172240 A | 6/1997 |
| WO | 2011060366 A2 | 5/2011 |
| WO | 2013097394 A1 | 7/2013 |

OTHER PUBLICATIONS

List of IBM Patents or Patent Applications Treated as Related; Date Filed: Jan. 22, 2015, pp. 1-2.

UK Search Report; Application No. GB1500444.3; Patent Act 1977; Combined Search and Examination Report under Section 17 and 18(3); Date Mailed: Jul. 9, 2015, pp. 1-8.

Christopher David Dolen, "Chameleon Shared Memory: Implementing a Thin Architectural Layer to Support Shared Memory Across Multiple Blades," A Thesis for Cornell University, Jan. 2008, pp. 1-63.

Javier de San Pedro, et al., "Physical Planning for the Architectural Exploration of Large-Scale Chip Multiprocessors," Seventh IEEE/ACM International Symposium on Networks on Chip (NoCS), Apr. 2013, pp. 1-2.

K. Kandalla, et al., "Designing Topology-Aware Collective Communication Algorithms for Large Scale InfiniBand Clusters: Case Studies with Scatter and Gather," IEEE, Parallel & Distributed Processing, Workshops and Phd Forum, Apr. 2010, pp. 1-8.

UK Intellectual Property Office, Application No. GB1401654.7; Patents Act 1977: Search Report Under Section 17(5); Date Mailed: Jul. 31, 2014, pp. 1-3.

Examination Report for GB Application No. GB1500444.3; mailed May 25, 2016; 3 pgs.

* cited by examiner

COMPUTER SYSTEM WITH GROUPS OF PROCESSOR BOARDS

FOREIGN PRIORITY

This application claims priority to Great Britain Patent Application No. 1401654.7, filed Jan. 31, 2014, and all the benefits accruing therefrom under 35 U.S.C. §119, the contents of which in its entirety are herein incorporated by reference.

BACKGROUND

The present invention relates in general to data processing systems, and in particular, to a computer system with processor boards arranged in groups with different stacking directions and a method for communicating across the processor boards.

In enterprise computer and networking systems, it is often advantageous to utilize high-density computer processing, data storage and telecommunication hardware components for the processing, storage, switching, routing and transport of high speed data in the form of digital signals. It is also advantageous for a plurality of these various components to communicate with each other at very high speed signaling rates. The use of a component-based system having separation of functions such as processing, storage, switching, and input/output interfaces allows individual components to be updated or upgraded independently from other components as well as allows customization for specific tasks. Furthermore, the use of components is cost effective since developing or purchasing a new component is less expensive than developing or purchasing an entirely new integrated hardware system that is not based on component design. Some such existing systems are hardwired and use a central switching architecture to allow components to communicate with one another.

Furthermore, the modern data center is suffering from the constraints of cabled, fixed-lane architectures. The concept of interconnecting racks of computing/storage servers through switching equipment with high-speed cables/fibers is taken for granted as the only method for providing connectivity. The fundamental technique used to provide random server-to-server communications is dominated by the Ethernet switch, and in modern data centers the switching architecture is typically implemented through a tiered tree design. A typical equipment rack contains twenty to forty servers that connect with Ethernet cables to the top-of-rack (TOR) switch. The TOR switches are then interconnected to the next tier in the switching system to an end-of-rack (EOR) switch (also known as a cluster switch). The EOR switch is normally a 10 gigabit Ethernet (10 GigE) switch with hundreds of ports. The EOR/cluster switches are then interconnected with 10 GigE (heading towards 40 GigE in the near future) uplinks to the next tier.

US 2013/0107853 A1 discloses a system and method for wireless communication in a backplane fabric mesh network architecture. A backplane network comprises a first antenna system located in a first network device cabinet including at least one first network device configured to transmit a data message over a high speed backplane. The first antenna system includes a first millimeter wave antenna of the first antenna system located external to the first device cabinet and configured to communicate with the first network device. The first millimeter wave antenna is configured to wirelessly transmit the data message from the first network device over the high speed backplane using emitted millimeter wave electromagnetic radiation. The network includes a second antenna system located in a second network device cabinet including at least one second network device, wherein the first and second device cabinets are positioned spatially apart from one another. The second antenna system includes a second millimeter wave antenna of the antenna system coupled to the second antenna system and located external to the second device cabinet. The second millimeter wave antenna is configured to wirelessly receive the data message over the high speed backplane using millimeter wave electromagnetic radiation emitted from the second millimeter wave antenna, wherein the received data message is handled by the second network device, the entire communication being handled without a central switch.

SUMMARY

In one embodiment, a computer system includes a plurality of printed circuit boards, each printed circuit board having one or more processor chips attached to the printed circuit board; wherein the number of printed circuit boards is an even number greater than or equal to 4, the printed circuit boards are arranged in two groups, each group being arranged in a different stacking direction, and wherein the one or more processor chips which are attached to each one of the printed circuit boards of one of the groups are connected for communication to the processor chips of each printed circuit board of the other group.

In another embodiment, a method is disclosed for connecting and communicating across a plurality of printed circuit boards of a computer system, each printed circuit board comprising one or more processor chips attached to the printed circuit board, wherein the number of printed circuit boards is an even number greater than or equal to 4. The method includes arranging the printed circuit boards in two groups, each group being arranged in a different stacking direction; and connecting the one or more processor chips, which are attached to each one of the printed circuit boards of one of the groups, for communication to the processor chips of each printed circuit board of the other group.

In another embodiment, a computer readable storage medium having computer readable instructions stored thereon that, when executed by a computer, implement a method for connecting and communicating across a plurality of printed circuit boards of a computer system, each printed circuit board comprising one or more processor chips attached to the printed circuit board, wherein the number of printed circuit boards is an even number greater than or equal to 4. The method includes arranging the printed circuit boards in two groups, each group being arranged in a different stacking direction; and connecting the one or more processor chips, which are attached to each one of the printed circuit boards of one of the groups, for communication to the processor chips of each printed circuit board of the other group.

DETAILED DESCRIPTION

Figure 1:
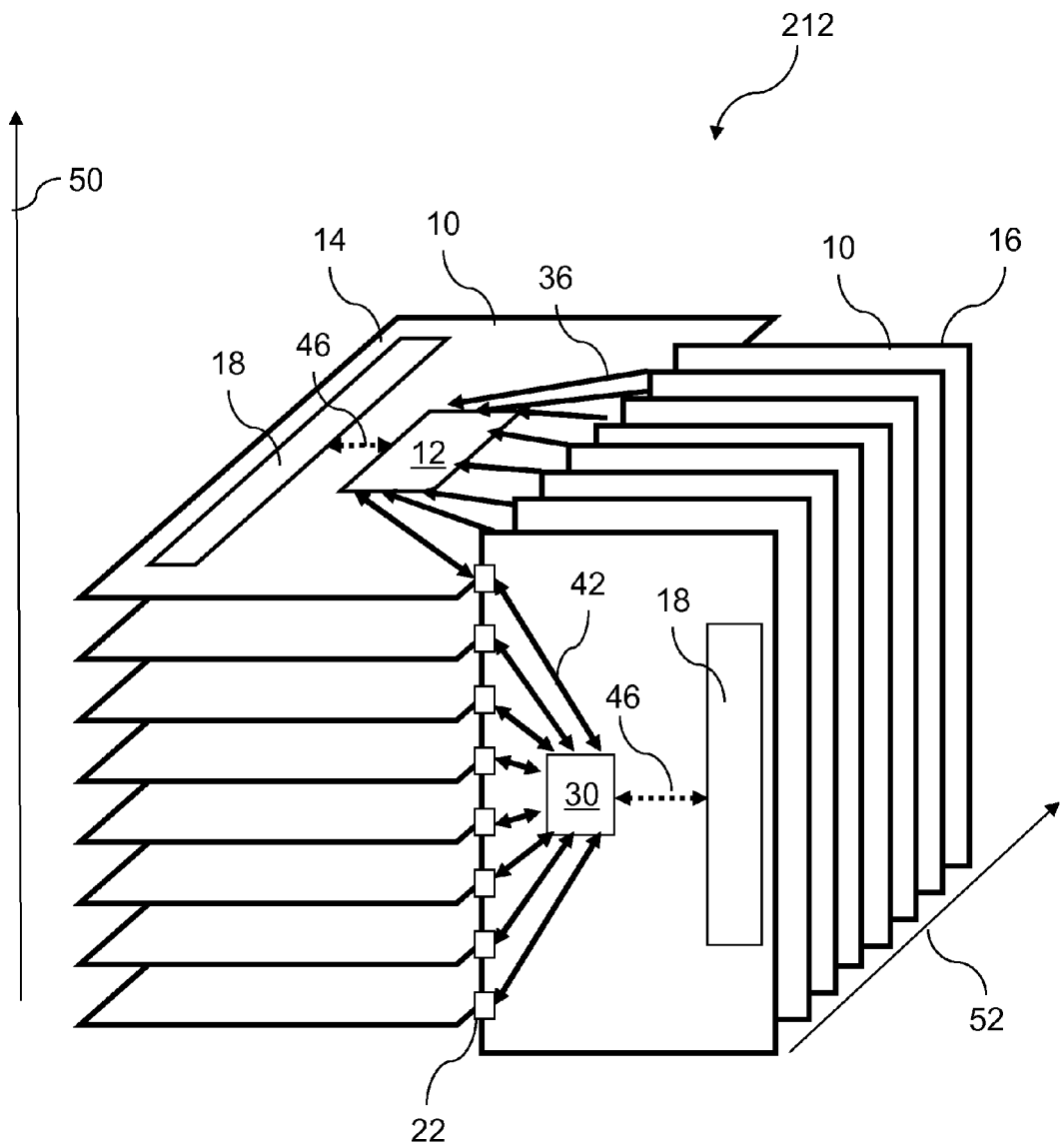
FIG. 1 is a computer system according to an embodiment of the invention, comprising 16 processor chips on two groups of 8 printed circuit boards each.

Aspects of the invention provide a computer system with multiple processor boards being interconnected in a space and cost saving manner, as well as to provide a method for connecting and communicating across multiple processor boards of a computer system being interconnected in a space and cost saving manner. These aspects are achieved by the features of the independent claims. The other claims, the drawings and the specification disclose advantageous embodiments of the invention.

According to a first aspect of the invention a computer system is proposed, comprising a plurality of printed circuit boards, each printed circuit board comprising one or more processor chips attached to the printed circuit board, wherein the number of printed circuit boards is an even number greater than or equal to 4, wherein the printed circuit boards are arranged in two groups each group being arranged in a different stacking direction and wherein the one or more processor chips which are attached to each one of the printed circuit boards of one of the groups are connected for communication to the processor chips of each printed circuit board of the other group.

A processor board may thus be implemented as a printed circuit board with one or more processor chips attached to it. The processor chips may be connected for communication via electrical and/or optical connection to the connectors of a printed circuit board and/or other processor chips on the same printed circuit board. The connections from the connectors of a printed circuit board to at least one processor chip of the printed circuit board may comprise power connections and communication connections as well.

The processor chips may be directly connected to the processor chips of other printed circuit boards or alternatively routed via other processor chips on the same printed circuit board thus communicating via processor chips on the same printed circuit board to other processor chips. The same applies to the processor chip to be communicated to, which too does not need to be connected directly but may also be routed through other processor chips on its printed circuit board.

Thus several embodiments for connection of processor chips attached to printed circuit boards according to the invention may exist:

Each processor chip connects to each processor chip on each printed circuit board of the other group of printed circuit boards.

Each processor chip connects to its peer processor chip on each other printed circuit board of the other group of printed circuit boards.

An individual processor chip only connects to some other printed circuit boards in the other group.

An individual processor chip may not be directly connected to processor chips on other printed circuit boards. Such a processor chip only connects to processor chips on the same printed circuit board.

Embodiments of the invention relate to a computer system implemented as a cost-efficient, high-performance large multiprocessor system with, for example, 16, 32 or 64 processor chips. Due to limitations of known solutions, applications requiring many processor chips typically use a cluster of small multiprocessor systems, where each multiprocessor system has 2 or 4 processor chips. The invention allows an application to use a single large multiprocessor system with, e.g., 64 processor chips, or a cluster of large multiprocessor systems, thus reducing costs or increasing performance. The printed circuit boards may exhibit different numbers of processor chips, e.g., printed circuit boards with 4 processor chips may be mixed with printed circuit boards with 2 processor chips. Thus it is possible to conceptually extend a multiprocessor system for higher number of processor chips, e.g., from 32 processor chips to 64 processor chips, without increasing the bandwidth of communication across the printed circuit boards, but instead increasing the number of hops for the communication from a specific processor chip on one printed circuit board to the processor chip on another printed circuit board of the same or another group of printed circuit boards. Also tailored systems may be implemented with a dedicated number of processor chips according to a specific application.

Embodiments of the invention describe a computer system, favorably of a shared memory type, comprising a group of printed circuit boards stacked in one direction connected for communication to a group of printed circuit boards stacked in another direction. The first group of printed circuit boards may be stacked, e.g., horizontally whereas the second group may be stacked vertically. Thus a multiprocessor system with 16 processor chips, e.g., may comprise a chassis with 8 vertical printed circuit boards (often called as blades) and 8 horizontal printed circuit boards, whereas a vertical printed circuit board shows the same configuration than the horizontal printed circuit board except for the orientation of the connectors. Each printed circuit board may comprise a processor chip which exhibits 8 connections, each to a board to board connector connected to the processor chip of each of the printed circuit boards of the other group.

Thus, embodiments of the invention describe a way to implement a computer system with a large number of processor chips interacting, avoiding the costly typical backplane or midplane in a chassis housing a large number of printed circuit boards. The inventive solution also serves for space saving in designing chassis for multiprocessor systems as it exhibits a very compact manner of interconnecting printed circuit boards with processor chips in direct connections from each one printed circuit board of one group to each printed circuit board of the other group. Thus it may be very convenient to change or remove an individual printed circuit board by simply unplugging it from the printed circuit boards of the other group without further disassembly of the computer system. A further advantage of the inventive solution is that all printed circuit boards may be identical thus realizing a very cost-efficient way of implementing a multiprocessor computer system.

Favorably, the stacking directions of the two groups of printed circuit boards may be arranged orthogonally. Stacking the printed circuit boards vertically in one group whereas stacking the printed circuit boards horizontally in another group of printed circuit boards is a very convenient and efficient way of arranging the printed circuit boards. Also it is very convenient for arranging the connectors for connecting the printed circuit boards of one group to the other group. Manufacturing of such a chassis for a multiprocessor system may also be very favorable.

Due to an advantageous embodiment, a processor chip may be connected to a memory device. Thus a printed circuit board is a common processor platform with a corresponding memory device for running the processor chip on its own and also enabling a shared memory access to all other processor chips connected to through the processor chip of a printed circuit board.

Favorably, the connection of the processor chip to a corresponding memory device may be performed using a memory subsystem. This memory subsystem may serve as an interface between the processor chip and a standard memory device like a DRAM (dynamic random access memory) memory chip, such as a DIMM (dual inline memory module) chip, which is a frequently used memory type in multiprocessor systems.

In an advantageous embodiment, the printed circuit board of one of the groups may be connected to each of the printed circuit boards of the other group via at least one connector of a plug type or a socket type or a combined plug and socket type. The printed circuit boards thus may exhibit the same layout except that the printed circuit boards of one group of printed circuit boards may exhibit plug type connectors and the printed circuit boards of the other group may exhibit socket type connectors. Alternatively it is thinkable that there may exist a mixed type connector which is a combined plug and socket type connector and which enables to use only one type of connector. Thus the printed circuit boards could exhibit the same layout each in either group of printed circuit boards.

Advantageously, the one or more processor chips on at least one of the printed circuit boards may be directly connected to the at least one connector on the same printed circuit board and, if more than one processor chip is on the printed circuit board, to all other processor chips on the same printed circuit board. By this way the processor chip may be connected and communicating to the processor chips on all the printed circuit boards of the other group of printed circuit boards of the computer system. A processor chip in one group may route communication across two processor chips in different boards in the other group. By this way the processor chip may be communicating to the processor chips on all the printed circuit boards of the same group of printed circuit boards of the computer system. Additionally the processor chip may be connected to all other processor chips on the same printed circuit board. A processor chip thus can communicate and exchange information as well as perform a shared memory access across all processor chips of the computer system.

In a favorable embodiment, at least one processor chip on at least one of the printed circuit boards of one of the groups may comprise a network interface. Software on the processor core of the processor chip may configure the local network interface to exchange one or more messages with the network interfaces on the other printed circuit boards. Thus a processor core may communicate via message passing across the various printed circuit boards.

Advantageously, the one or more processor chips which are attached to each one of the printed circuit boards of one of the groups may be connected to each of the processor chips of all printed circuit boards of the other group via at least one network router and a network interface controller. In such an arrangement a cluster of processor chips may be configured on the printed circuit board wherein one or more processor chips are connected to the at least one network router via a network interface controller. Such a configuration may be used on each of the printed circuit boards of a multiprocessor system. Thus a scalable network may be customized in the inventive multiprocessor system with, e.g., 2 network interface controllers arranged on a printed circuit board for a 32 processor system and with 4 network interface controllers arranged on a printed circuit board for a 64 processor system. Such a configuration is very flexible to be scaled even on large multiprocessor systems as well as may be distributed over a large multiprocessor system if needed for speed of access and reliability.

In a favorable embodiment, at least one processor chip on a printed circuit board of one of the groups may be connected to a PCI Express card providing access to the PCI Express card for at least one processor chip on another printed circuit board of the same or another group. Thus, a very efficient use of resources in a multiprocessor system can be implemented.

According to a further advantageous aspect of the invention, a method for connecting and communicating across a plurality of printed circuit boards of a computer system is proposed, each printed circuit board comprising one or more processor chips attached to the printed circuit board, wherein the number of printed circuit boards is an even number greater than or equal to 4, wherein the printed circuit boards are arranged in two groups each group being arranged in a different stacking direction, and wherein the one or more processor chips which are attached to each one of the printed circuit boards of one of the groups are connected for communication to the processor chips of each printed circuit board of the other group.

The invention relates to communication within a cost-efficient, high-performance large multiprocessor system with, for example, 16, 32 or 64 processor chips. Applications requiring many processors typically use a cluster of small multiprocessor systems, where each multiprocessor system has 2 or 4 processor chips. The invention allows an application to use a single large multiprocessor system with, e.g., 64 processor chips, or a cluster of large multiprocessor systems, thus reducing costs or increasing performance.

Thus, embodiments of the invention describe a way to implement a multiprocessor system with a large number of processors interacting and avoiding the costly typical backplane or midplane in a chassis housing a large number of printed circuit boards.

The inventive solution also serves for space saving in designing chassis for multiprocessor systems.

Advantageously, the communication across the processor chips may be performed via a coherent shared memory access, which means that each processor chip has a coherent cached access to the memory of another processor chip, e.g., a DRAM memory device, such as a DIMM chip. This may serve for implementing scalable memory solutions for applications of a multiprocessor system in a very convenient and cost saving way. Thus memory and network traffic may be reduced especially in large multiprocessor systems.

Alternatively, the communication across the processor chips may be performed via a non-coherent shared memory access, meaning that each processor chip has load/store access to the memory of another processor chip, e.g., a DRAM memory device, such as a DIMM chip. For certain applications this may be a favorable way of accessing memory resources.

In another embodiment, the communication across the processor chips may provide a processor chip usage access to a graphics, storage, communication or other adapter card attached via the PCI (peripheral component interconnect)—interface to another processor chips. PCI is a commonly used standard interface description for connecting peripheral devices.

Due to an alternative embodiment, the communication across the processor chips may also be performed via message passing using a network protocol, like Ethernet, Infiniband or a proprietary protocol. Message passing is also a frequently used standard for the exchange of information in distributed computer systems. Message passing is based on a plurality of processes communicating to each other via messages which are sent from one process to another designated process, using a high speed network for exchange. One of the advantages is that communication also functions across the borders of different computer systems.

Favorably, the communication across the processor chips may be performed using communication between two or more processor chips on the same printed circuit board. In this embodiment each of the processor chips may not be directly connected to the connector of the printed circuit board. Therefore communication from one processor chip of another printed circuit board may be routed through a second processor chip on the same printed circuit board which is directly connected to the connector of the printed circuit board. Even a processor chip may not be connected to the connector but only to other processor chips on the same printed circuit board.

Advantageously, the communication across the processor chips may be performed via at least one network router and a network interface controller connected to at least one processor chip on at least one printed circuit board. In such an arrangement, a cluster of processor chips may be configured on the printed circuit board wherein one or more processor chips are connected to the at least one network router via a network interface controller. Such a configuration may be used on each of the printed circuit boards of a multiprocessor system.

Due to the inventive solution a printed circuit board may be unconnected by previously idling its one or more processor chip via a hypervisor running on the computer system. A printed circuit board may be needed to be removed from the multiprocessor system for service and therefore shall be unlogged from the operating system. This may be performed by a hypervisor of typical operating systems as used in multiprocessor systems, such as Linux or AIX. The remaining printed circuit boards thus represent the multiprocessor system with a reduced number of processors communicating with a reduced aggregate bandwidth due to the removed printed circuit board comprising one or more processor chips, whereas the computer system remains still functioning.

Advantageously, the communication may be tracked by a precise directory, thus exhibiting a directory based cache coherence for shared memory access across the plurality of processor chips of the computer system. The precise directory thus tracks all the processor chips in the computer system and controls the communication across the processor chips.

According to a further advantageous aspect of the invention, a data processing program for execution in a data processing system is proposed comprising an implementation of an instruction set for performing a method as described above when the data processing program is run on a computer.

Further a favorable computer program product is proposed comprising a computer usable medium including a computer readable program, wherein the computer readable program when executed on a computer causes the computer to perform a method for connecting and communicating across a plurality of printed circuit boards of a computer system, each printed circuit board comprising one or more processor chips attached to the printed circuit board, wherein the number of printed circuit boards is an even number greater than or equal to 4, wherein the printed circuit boards are arranged in two groups each group being arranged in a different stacking direction, and wherein the one or more processor chips which are attached to each one of the printed circuit boards of one of the groups are connected for communication to each of the processor chips of all printed circuit boards of the other group.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire connection, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to block diagrams of methods, apparatus (systems) and computer program products according to embodiments of the invention. It will be understood that each block of the flowchart illustrations and/or block diagrams, and combinations of blocks in the block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the block diagram block or blocks.

Due to a further aspect of the invention, a data processing system for execution of a data processing program is proposed, comprising software code portions for performing a method described above.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

Referring now to FIG. 1, a computer system 212 according to an embodiment of the invention is shown, comprising 16 processor chips 12, 30 on two groups 14, 16 of 8 printed circuit boards 10 each. The computer system 212 is comprising a plurality of 16 printed circuit boards 10, each printed circuit board 10 comprising one or more processor chips 12, 30 attached to the printed circuit board 10, wherein the number of printed circuit boards 10 is an even number greater than or equal to 4, namely 16 in the embodiment shown, wherein the printed circuit boards 10 are arranged in two groups 14, 16, each group 14, 16 being arranged in a different stacking direction 50, 52, and wherein the one or more processor chips 12, 30 which are attached to each one of the printed circuit boards 10 of one of the groups 14 are directly connected for communication to a processor chip 30, 12 of each printed circuit board 10 of the other group 16. The stacking directions 50, 52 of the two groups 14, 16 are arranged orthogonally in the embodiment shown. Each processor chip 12, 30 is connected 46 to a memory device 18. Each printed circuit board 10 of one of the groups 14, 16 is connected to each printed circuit board 10 of the other group 16, 14 via at least one connector 22 of a plug type or a socket type or a combined plug and socket type. There may be one single connector type on a printed circuit board 10. Alternatively the connections may also be arranged in more than one connector type on a single printed circuit board 10. The one processor chip 12, 30 on at least one of the printed circuit boards 10 is directly connected to the at least one connector 22 on the same printed circuit board 10 via connections 36, 42.

Figure 10:
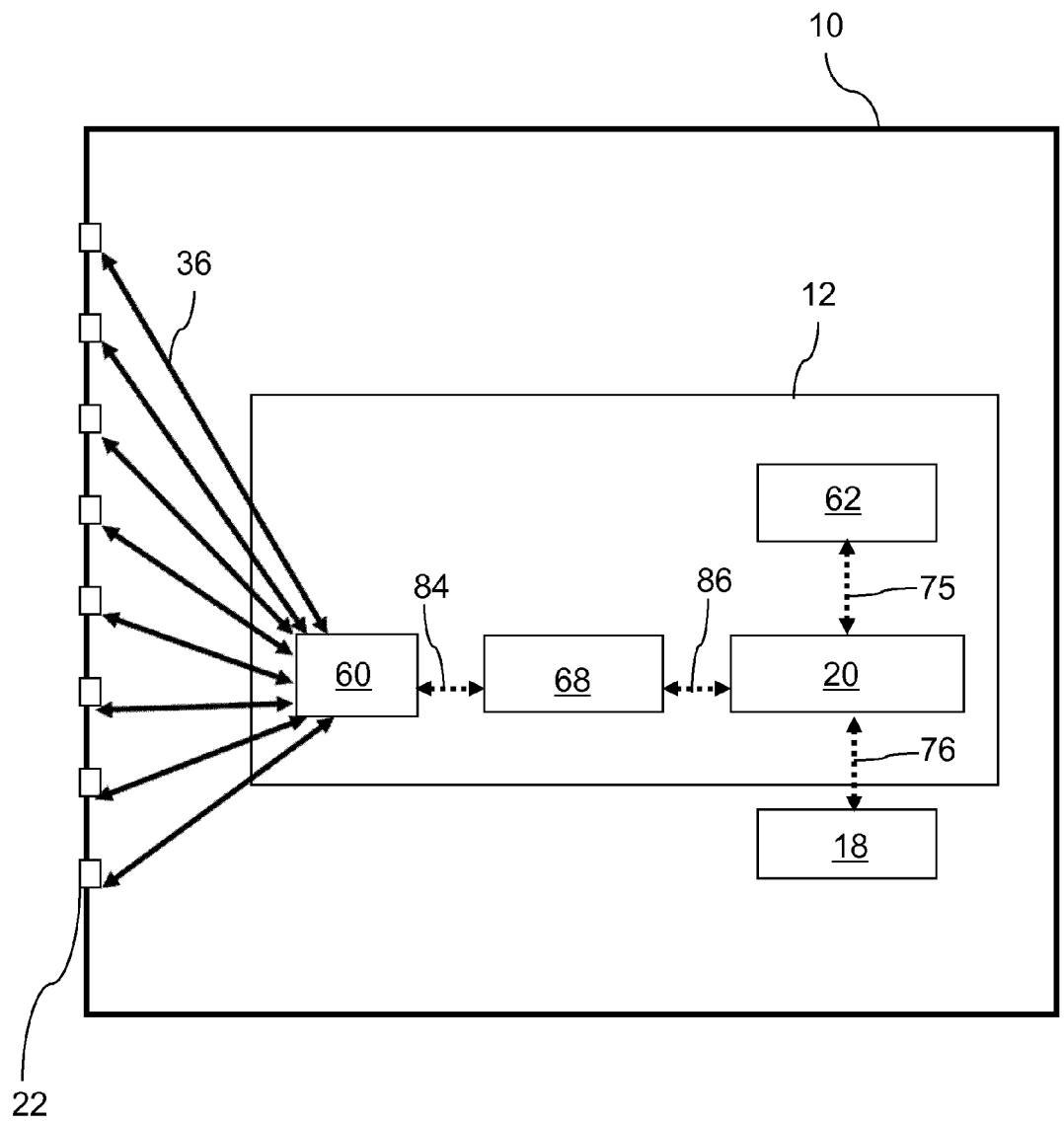
FIG. 10 is a printed circuit board with one processor chip according to a further embodiment of the invention, exhibiting message passing using a network protocol for communication.

At least one processor chip 12 on at least one of the printed circuit boards 10 of one of the groups 14, 16 may comprise a network interface 68 (see FIG. 10). Software on the processor chip 12 may configure the local network interface 68 to exchange one or more messages with the network interfaces 68 on the other printed circuit boards. Thus the processor chip 12 may communicate via message passing across the various printed circuit boards 10.

The computer system 212 shown in FIG. 1 may implement a method for connecting and communicating across the plurality of printed circuit boards 10 of the computer system 212, wherein the one or more processor chips 12, 30 which are attached to each one of the printed circuit boards 10 of one of the groups 14, 16 are directly connected for communication to the processor chips 30, 12 of each printed circuit board 10 of the other group 16, 14. A direction connection is processor 30 over connection 42 to connector 22 over connection 36 to processor 12 of the other group 14. In other words a processor chip 30 has a one hop communication with a processor 12 in the other group 14. A processor chip 30 in one group 16 may route communication across two processor chips 12 in different boards 10 in the other group 14. By this way the processor chip 30 may be communicating to the processor chips 30 on all the printed circuit boards 10 of the same group 16 of printed circuit boards 10 of the computer system 212. In other words, a processor chip 30 has a two hop communication with a processor chip 30 in the same group 16. The communication across the processor chips 12, 30 may be performed e.g., via a non-coherent or coherent shared memory access. The communication may be tracked by a precise directory.

If a printed circuit board 10 shall be removed from the computer system 212, e.g., for service, the printed circuit board 10 may be unconnected by previously idling the processor chip 12 via a hypervisor running on the computer system 212. The computer system 212 may run with a different number of printed circuit boards 10 in each group 14, 16.

Figure 2:
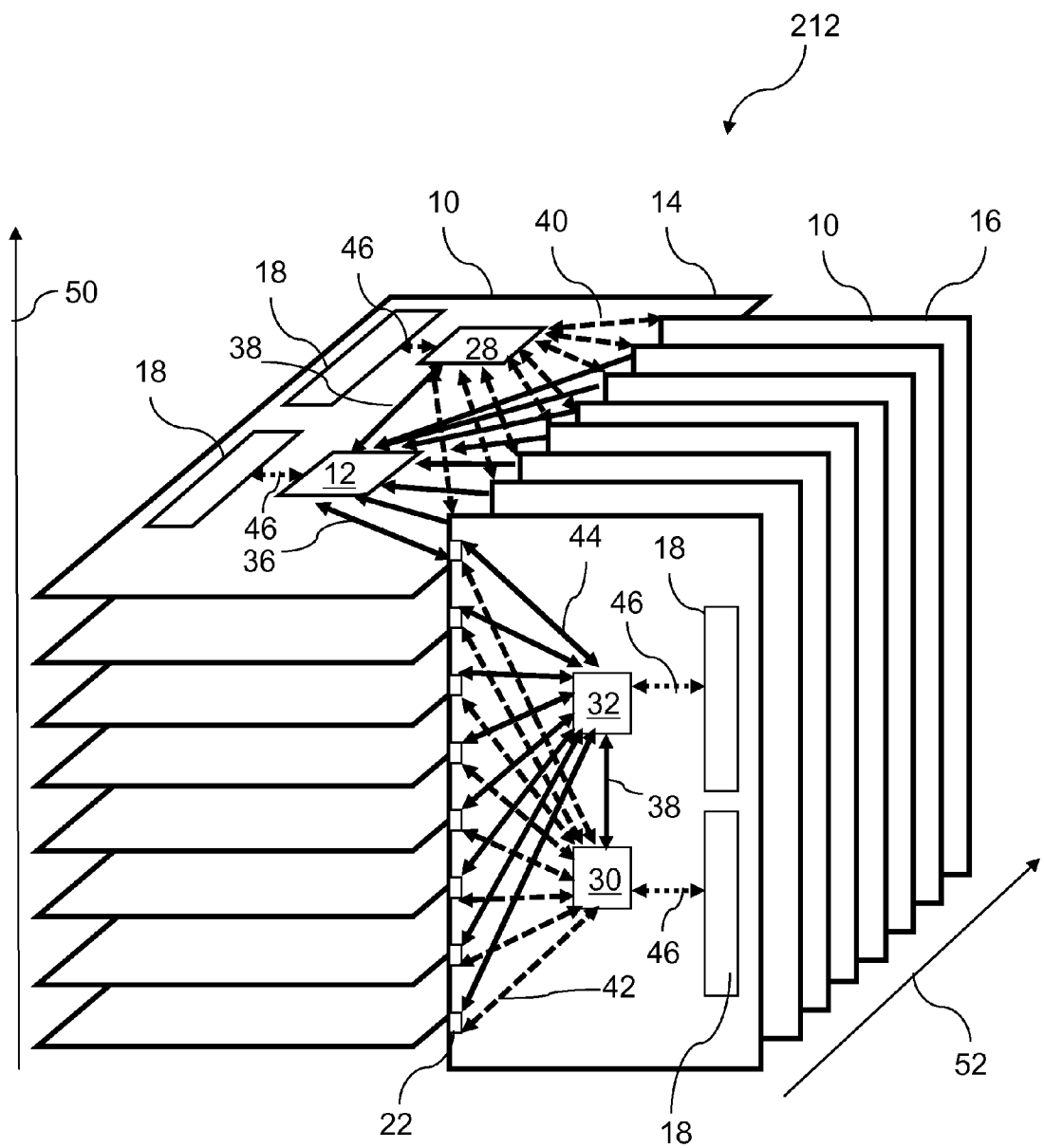
FIG. 2 is a computer system according to an embodiment of the invention, comprising 32 processor chips on two groups of 8 printed circuit boards each.

In FIG. 2, a computer system 212 according to an embodiment of the invention is shown, comprising 32 processor chips 12, 28, 30, 32 on two groups 14, 16 of 8 printed circuit boards 10 each. The processor chips 12, 28, 30, 32 are connected via connections 46 to their corresponding memory devices 18. Processor chip 12 is further connected to the connectors 22 via connections 36, processor chip 28 via connections 40, processor chip 30 via connections 42, and processor chip 32 via connections 44. The interconnection between processor chips 12 and 28, as well as between processor chips 30 and 32 is performed using connections 38. In a first alternative without the dashed connections 42 and 40, processor chip 32 on each card in its group is directly connected to its so-called peer processor chip 12 on each card in the other group. Processor chip 32 thus has two hops to its non-peer processor chip 28 via processor chip 12 on each card in the other group. Processor chip 32 thus has three hops to its non-peer processor chip 30 on each other card in its own group. In a second alternative with the dashed connections 42 and 40, processor chip 32 on each card in its group is directly connected to both processor chip 12 and to processor chip 28 on each card in the other group. Processor chip 32 thus has one hop to either processor chip 12 or 28 on each card in the other group. Processor chip 32 thus has two hops to either processor chip 30 or 32 on each other card in its own group.

Figure 3:
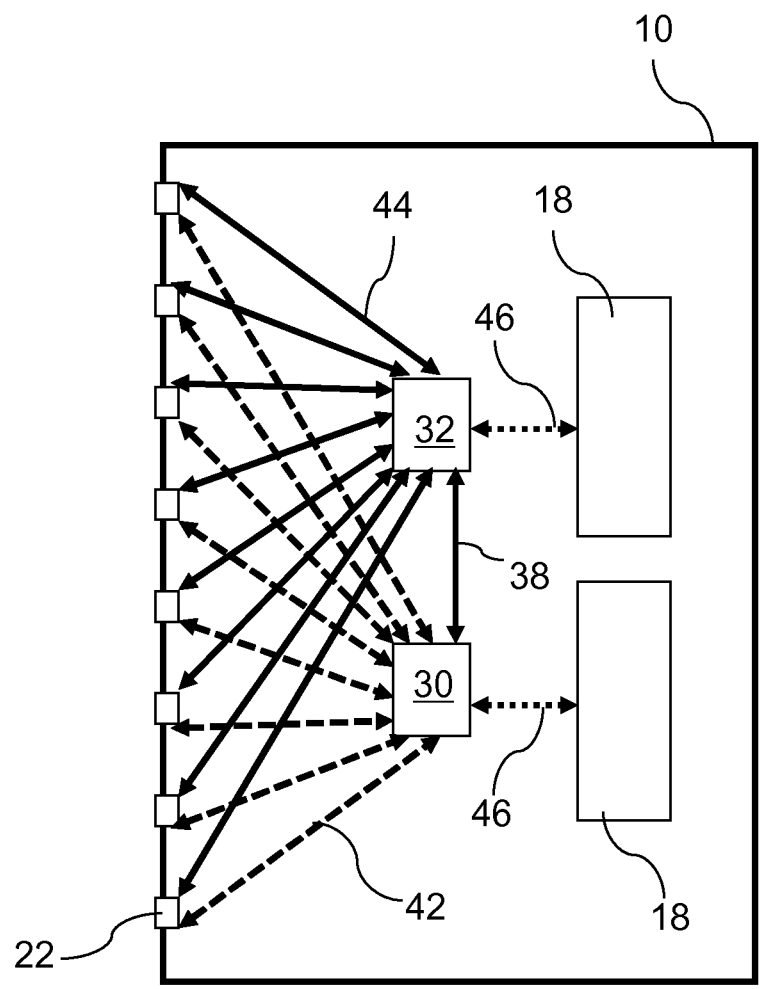
FIG. 3 is a printed circuit board with 2 processor chips according to the embodiment of the invention described in FIG. 2.

FIG. 3 depicts a printed circuit board 10 with 2 processor chips 30, 32 according to the embodiment of the invention described in FIG. 2. The processor chips 30, 32 are connected via connections 46 to their corresponding memory devices 18. Processor chip 30 is further connected to the connectors 22 via connections 42, processor chip 32 via connections 44. The interconnection between processor chips 30 and 32 is performed using connection 38. At connector 22, connection 42 does not typically connect nor partially connect to connection 44. Thus the dashed connection 42 is only an alternative embodiment for the connection of a processor chip 30 to the connectors 22 instead of processor chip 32.

Figure 4:
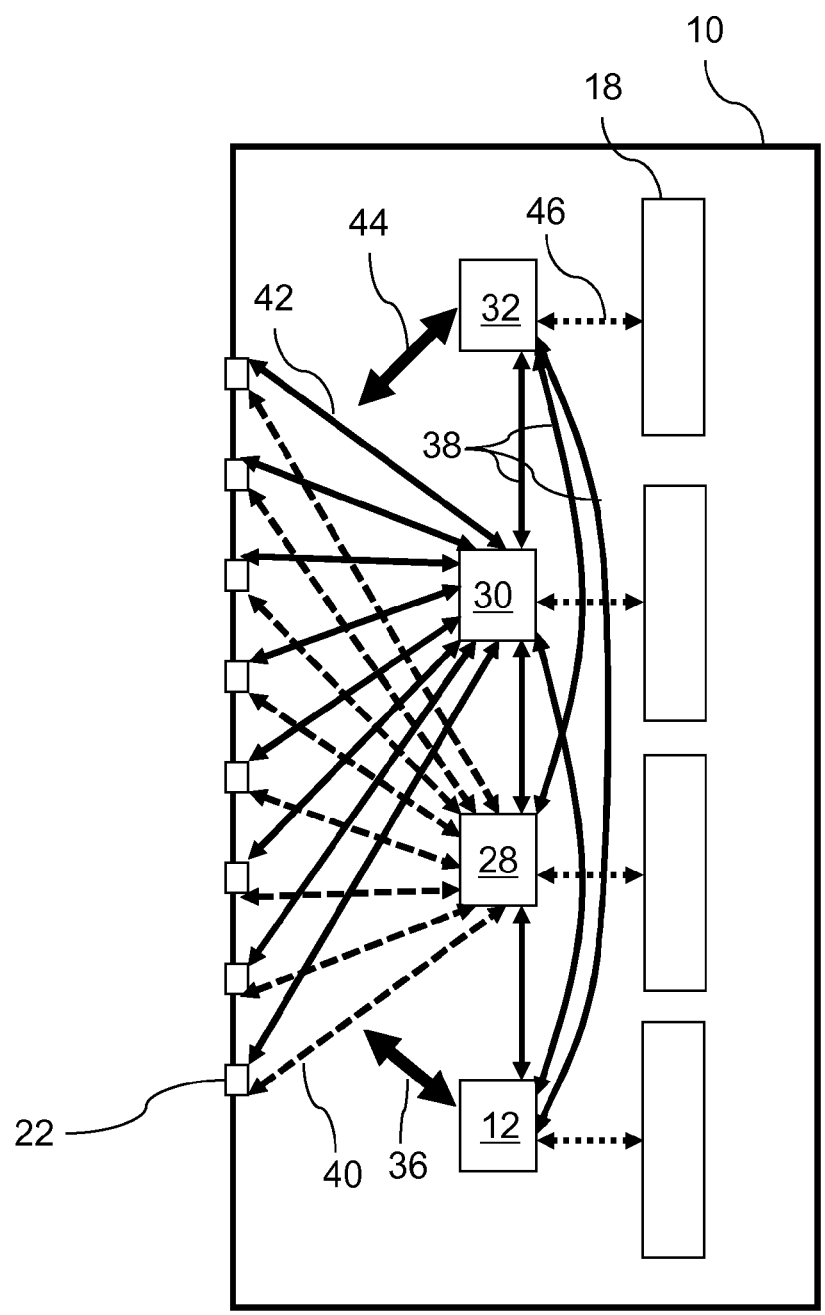
FIG. 4 is a printed circuit board with 4 processor chips according to another embodiment of the invention.

In FIG. 4, a printed circuit board 10 is shown with 4 processor chips 12, 28, 30, 32 according to another embodiment of the invention. The processor chips 12, 28, 30, 32 are connected via connections 46 to their corresponding memory devices 18. Processor chip 12 is further connected to the connectors 22 via connections 36, processor chip 28 via connections 40, processor chip 30 via connections 42, and processor chip 32 via connections 44. The connections 36 and 44 are depicted as a single connection each for simplification of the Figure. The connections 36, 40, 42 and 44 are to be understood as alternative connections which may only partially be implemented. Only one of them is necessary for the functioning of the printed circuit board 10. The interconnection between the processor chips 12, 28, 30 and 32 to each other is performed using connections 38.

Figure 5:
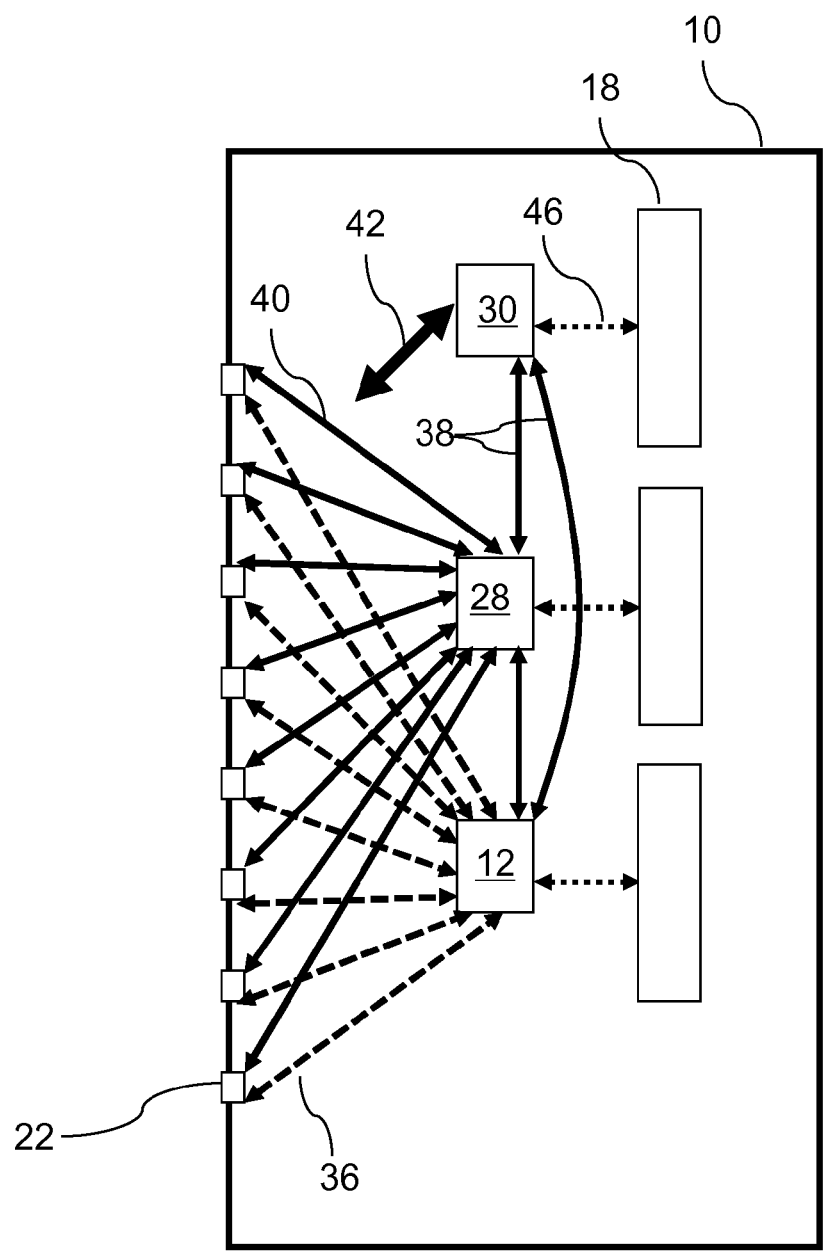
FIG. 5 is a printed circuit board with 3 processor chips according to another embodiment of the invention.

FIG. 5 depicts a printed circuit board 10 with 3 processor chips 12, 28, 30 according to another embodiment of the invention. The processor chips 12, 28, 30 are connected via connections 46 to their corresponding memory devices 18. Processor chip 12 is further connected to the connectors 22 via connections 36, processor chip 28 via connections 40, and processor chip 30 via connections 42. The connections 42 are depicted as a single connection for simplification of the Figure. Again, the connections 36, 40 and 42 are to be understood as alternative connections which may only partially be implemented. Only one of them is necessary for the functioning of the printed circuit board 10. The interconnection between the processor chips 12, 28, and 30 to each other is performed using connections 38.

Figure 6:
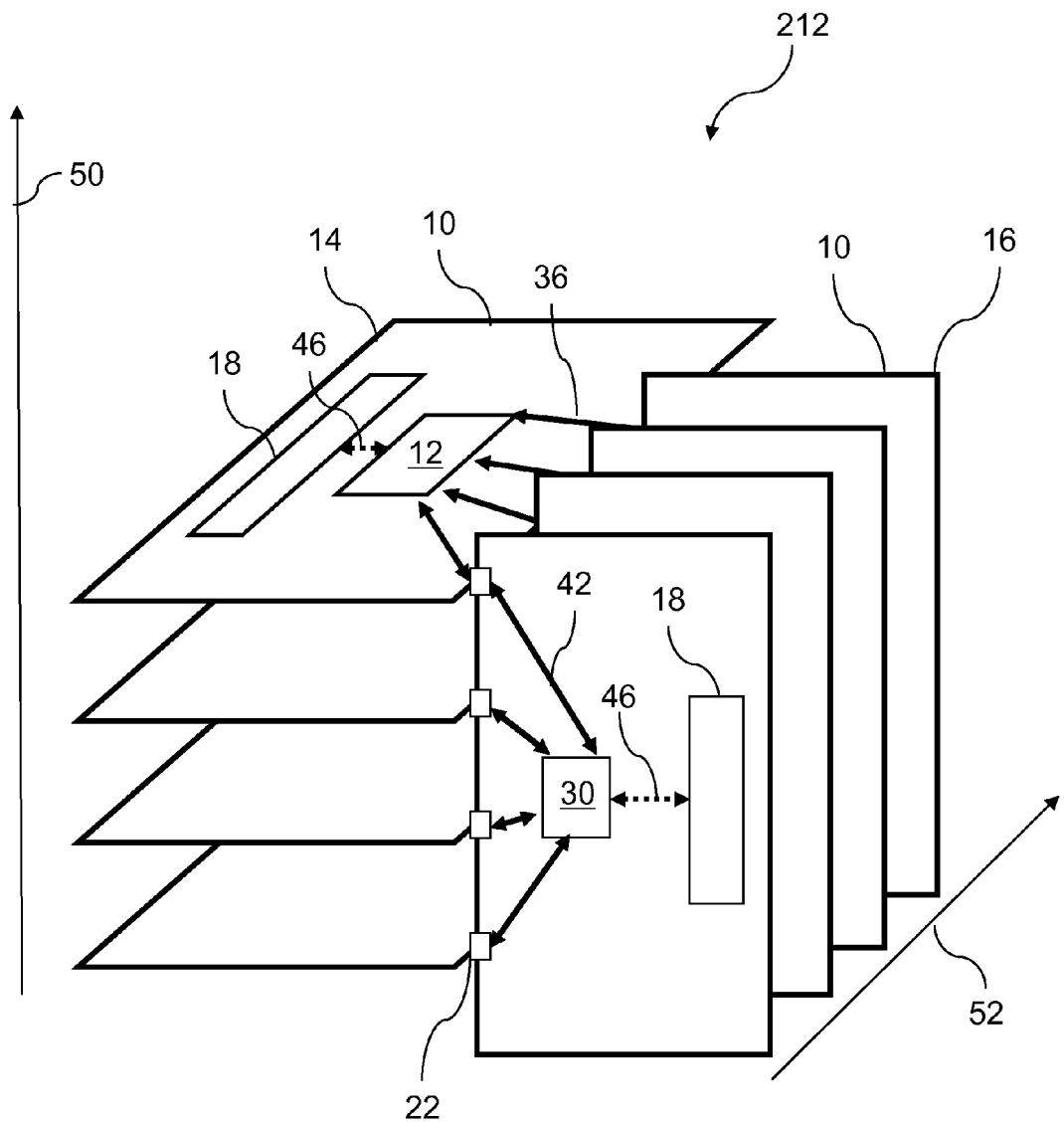
FIG. 6 is a computer system according to a further embodiment of the invention, comprising 8 processor chips on two groups of 4 printed circuit boards each.

FIG. 6 shows a computer system 212 according to a further embodiment of the invention, comprising 8 processor chips 12, 30 on two groups 14, 16 of 4 printed circuit boards 10 each. In this embodiment the connection of the processor chip 12 to a corresponding memory device 18 is performed using connection 46. The processor chip 12 is connected via connections 36 to the connectors 22 of the printed circuit board 10. In group 16 connection of the processor chip 30 to a corresponding memory device 18 is also performed via connection 46. The processor chip 30 is connected via connections 42 to the connectors 22 of the printed circuit board 10. It should be emphasized that 4+4 printed circuit boards, or other number N+N printed circuit boards are possible, instead of 8+8 printed circuit boards shown in other Figures.

Figure 7:
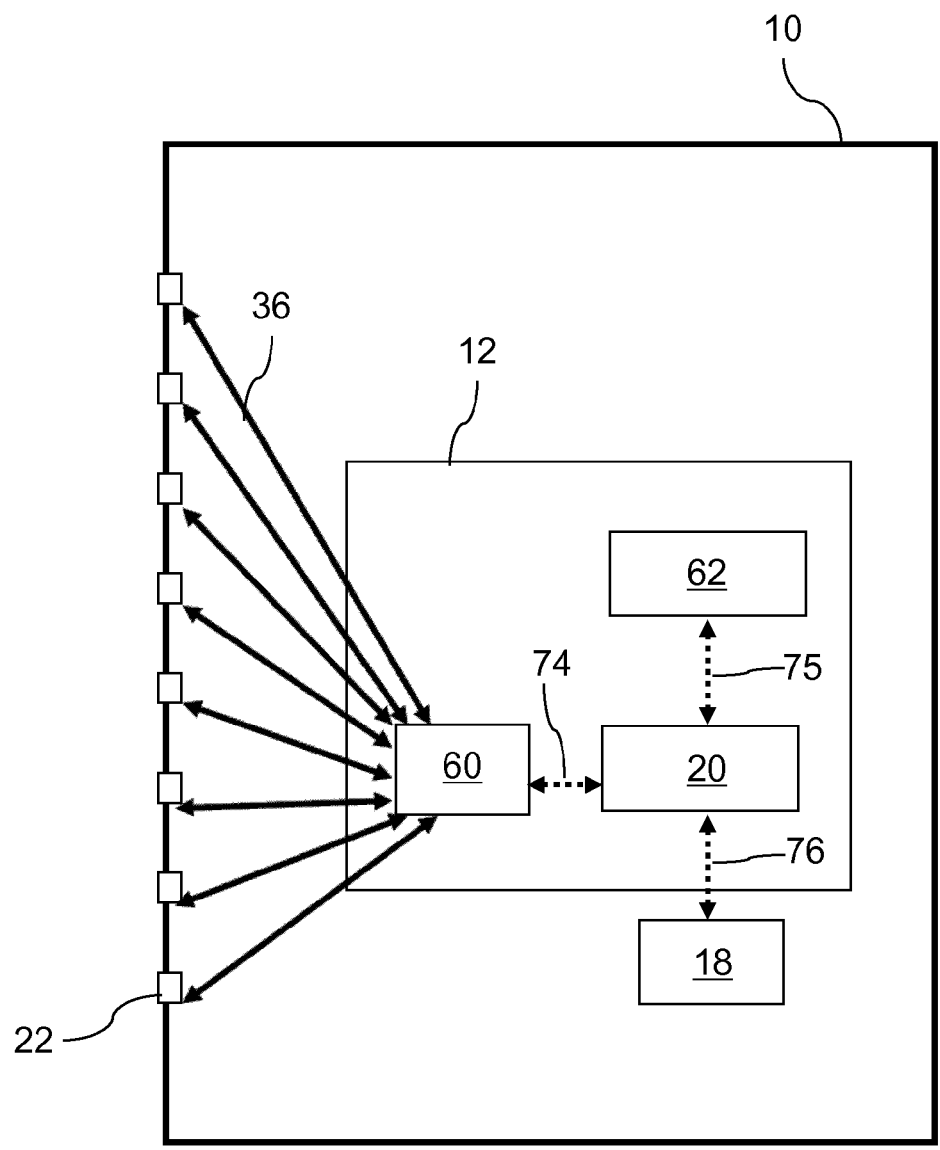
FIG. 7 is a printed circuit board with one processor chip according to an embodiment of the invention, exhibiting coherent shared memory access.

In FIG. 7, a printed circuit board 10 with one processor chip 12 according to an embodiment of the invention is shown, exhibiting coherent shared memory access. The processor chip 12 comprises a router 60 which is connected to the connectors 22 of the printed circuit board 10 via connections 36 thus directly connected to the routers 60 of each printed circuit board 10 of the other group 16 of the computer system 212. Further, the router 60 is connected to a memory subsystem 20 via connection 74. The memory subsystem 20 is connected to a processor core 62 via connection 75 and to a memory device 18, e.g., a DRAM memory device like a DIMM chip, via connection 76. The local memory subsystem 20 may cache a copy of some memory contents from another processor chip 28 in the computer system 212. A direction connection is processor 12 via router 60 over connection 36 to connector 22 to the router 60 of a processor 30 of the other group 16. In other words a processor chip 12 has a one hop communication with a processor 12 in the other group 14. The router 60 of a processor chip 30 in one group 16 may route communication across the routers 60 of two processor chips 30 in different boards 10 in the other group 16. By this way the processor chip 12 may be communicating to the processor chips 12 on all the printed circuit boards 10 of the same group 14 of printed circuit boards 10 of the computer system 212. In other words, a processor chip 12 has a two hop communication with a processor chip 12 in the same group 14.

Figure 8:
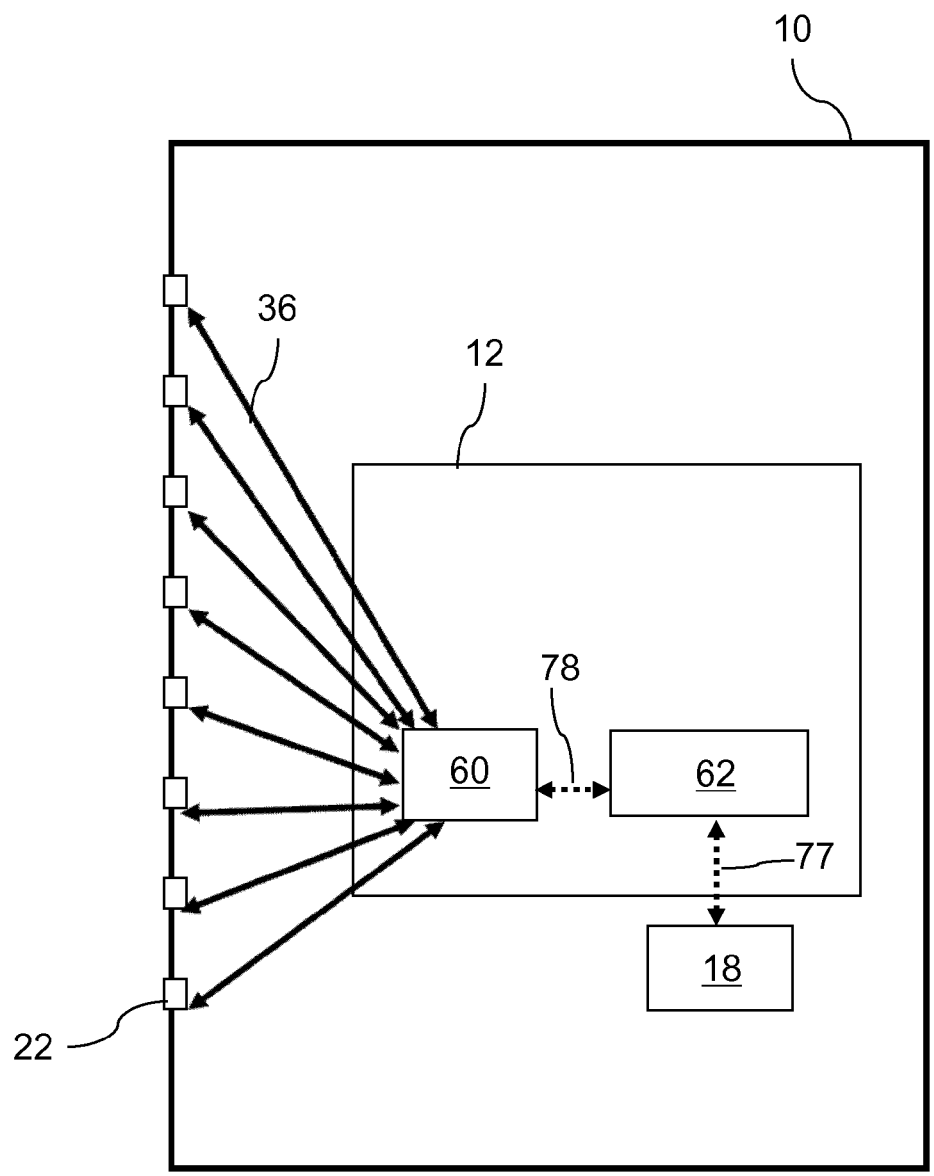
FIG. 8 is a printed circuit board with one processor chip according to a further embodiment of the invention, exhibiting non-coherent shared memory access.

FIG. 8 shows a printed circuit board 10 with one processor chip 12 according to a further embodiment of the invention, exhibiting non-coherent shared memory access. The processor chip 12 comprises a router 60 which is connected to the connectors 22 of the printed circuit board 10 via connections 36 thus communicating to the routers 60 of all other printed circuit boards 10 of the computer system 212. Further the router 60 is connected to a processor core 62 via connection 78, whereas the processor core 62 itself is connected to a memory device 18, e.g., a DRAM memory device like a DIMM chip, via connection 77. As the processor chip 12 has direct load/store access to the memory device 18 of any other processor chip 28, via its own router 60 and that of the other processor chip 30, there is no need for a local cache copy. A direction connection is processor 12 via router 60 over connection 36 to connector 22 to the router 60 of a processor 30 of the other group 16. In other words a processor chip 12 has a one hop communication with a processor 12 in the other group 14. The router 60 of a processor chip 30 in one group 16 may route communication across the routers 60 of two processor chips 30 in different boards 10 in the other group 16. By this way the processor chip 12 may be communicating to the processor chips 12 on all the printed circuit boards 10 of the same group 14 of printed circuit boards 10 of the computer system 212. In other words, a processor chip 12 has a two hop communication with a processor chip 12 in the same group 14.

Figure 9:
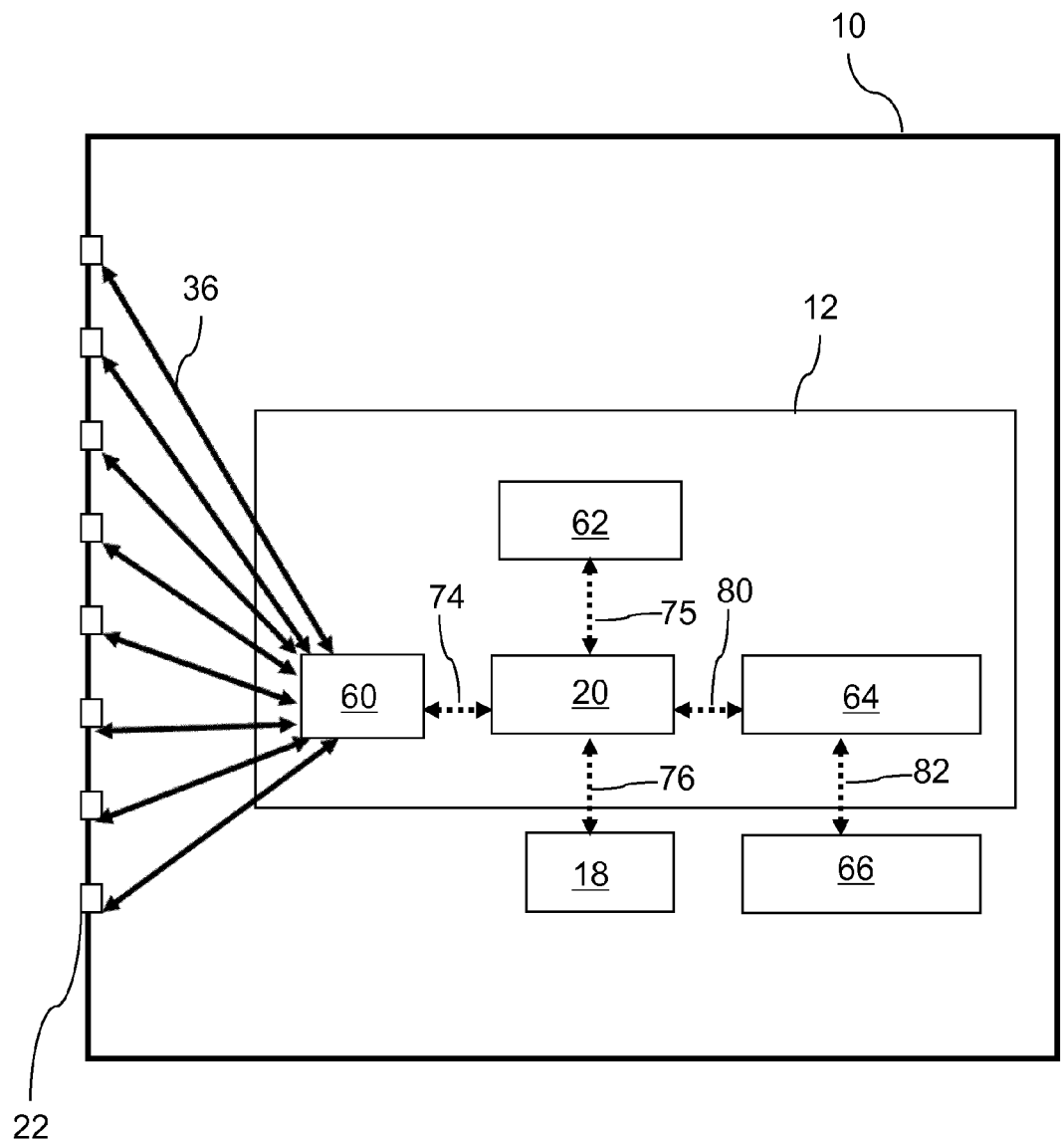
FIG. 9 is a printed circuit board with one processor chip according to another embodiment of the invention, exhibiting a PCI-connection for an expansion card.

In FIG. 9, a printed circuit board 10 with one processor chip 12 according to another embodiment of the invention is shown, exhibiting PCI-connection 82 for an expansion card 66. The processor chip 12 comprises a router 60 which is connected to the connectors 22 of the printed circuit board 10 via connections 36 thus communicating to the routers 60 of the processor chips all other printed circuit boards 10 of the computer system 212. Further the router 60 is connected to a memory subsystem 20, via connection 74. The memory subsystem 20 is connected to a processor core 62 via connection 75 and to a memory device 18, e.g., a DRAM memory device like a DIMM chip, via connection 76. The local memory subsystem 20 may cache a copy of the memory device 18 of any other processor chip 28. The memory subsystem 20 is connected to a PCI Express host 64 on the processor chip 12 via connection 80, which provides a PCI-connection 82 for a PCI Express card 66. Access to the PCI Express card 66 for other processor chips 28 on other printed circuit boards 10 of the same group 14 or another group 16 is provided via the router 60 of the processor chips 12.

For example, the PCI Express card 66 may be a network card for external communication of the computer system 212 via Ethernet or the like.

FIG. 10 shows a printed circuit board 10 with one processor chip 12 according to a further embodiment of the invention, exhibiting message passing using a network protocol for communication. In this embodiment the router 60 is connected to a network interface 68 which is connected via connection 86 to a memory subsystem 20, wherein the memory subsystem 20 is connected to a processor core 62 and a memory device 18 as in other embodiments with coherent shared memory access. Software on the processor core 62 configures the local network interface 68 to exchange one or more messages with the network interfaces 68 on the other printed circuit boards 10. Thus the computer system 212 may refer to the multiple printed circuit boards 10 as a computer cluster. In various scenarios, message passing may provide features or performance better than shared memory access. Various systems may support both message passing and shared memory across processor cores 62.

Figure 11:
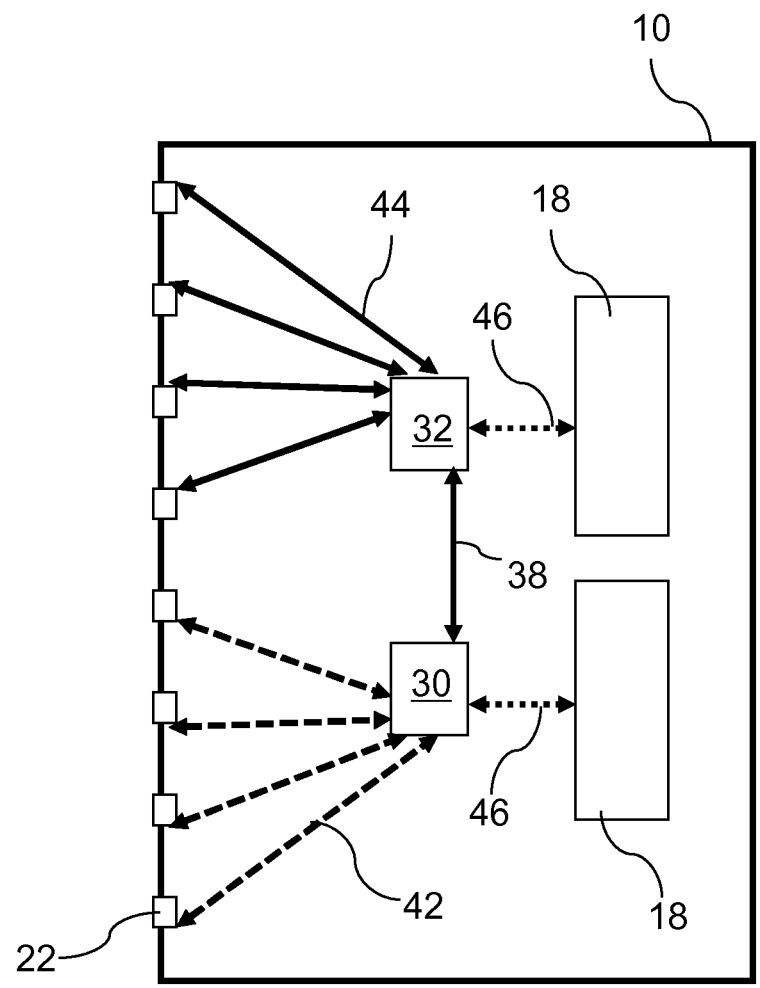
FIG. 11 is a printed circuit board with two processor chips according to a further embodiment of the invention, where each processor chip is connected to only a subset of the connectors of the printed circuit board.

In FIG. 11, a printed circuit board 10 with two processor chips 30, 32 according to a further embodiment of the invention is shown, where each processor chip 30, 32 is connected to only a subset of the connectors 22 of the printed circuit board 10. With two or more processor chips 30, 32 on a printed circuit board 10, each processor chip 30, 32 might not be directly connected to all the connectors 22 on the printed circuit board 10. Thus, a communication packet destined for this printed circuit board 10 might arrive on a link of the destination processor chip 30. Otherwise, the communication packet might hop through another processor chip 32. Similarly for a communication packet hopping through this printed circuit board 10. If incoming and outgoing connectors 22 are attached to the same processor chip 30, then the packet might hop just through that processor chip 30. Otherwise, it might hop through both processor chips 30, 32. Also, it should be mentioned that on a printed circuit board 10, a processor chip 30 may be connected to any other processor chip 32 on the same printed circuit board 10, but not be connected to the connectors 22 of the printed circuit board 10 indicated by the dashed connection 42 to the connectors 22. Therefore, if processor chip 30 is communicating to processor chips 12, 28 of printed circuit boards 10 of another group 14 then communication is running over processor chip 32 then to the processor chips 12, 18 on other printed circuit boards 10 of the other group 14 or to processor chips 30, 32 of the same group 16 involving additional hopping of communication across processor chips 32, 12, 28.

Figure 12:
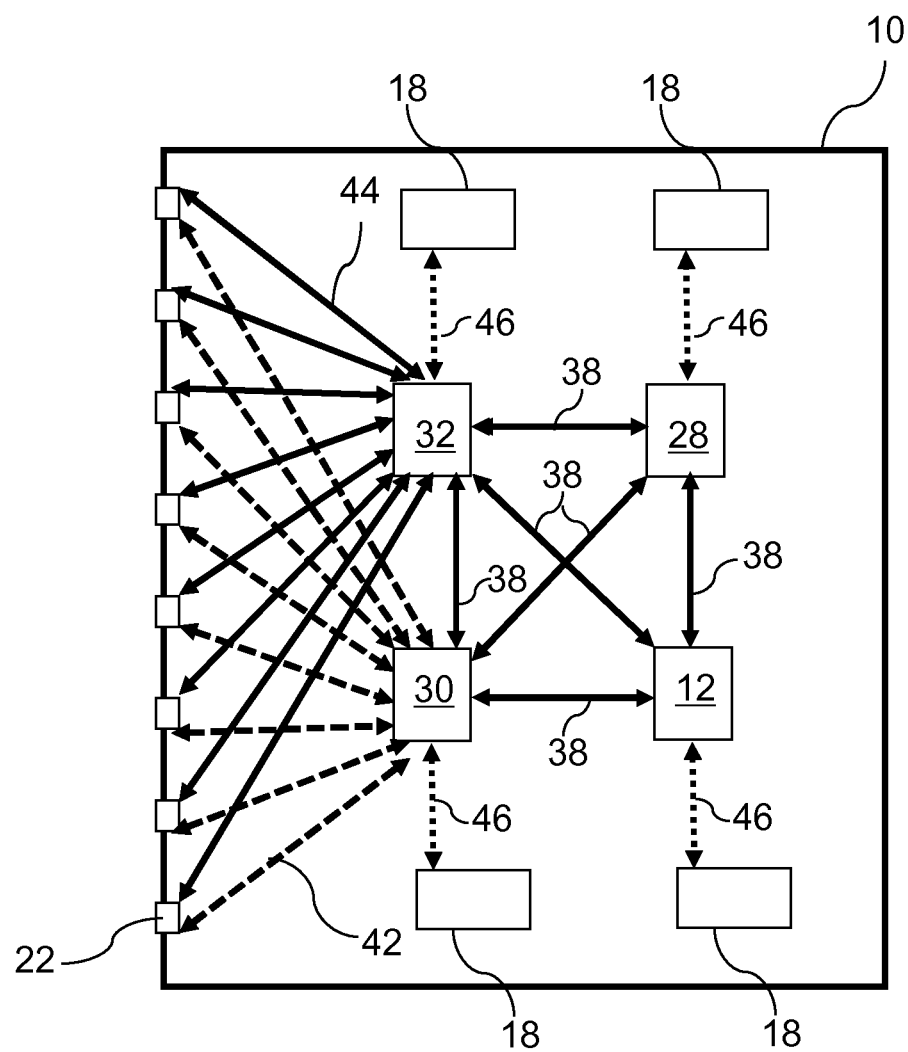
FIG. 12 is a printed circuit board with four processor chips according to a further embodiment of the invention, where two processor chips are connected to only two other processor chips of the same printed circuit board.

FIG. 12 shows a printed circuit board 10 with four processor chips 12, 28, 30, 32 according to a further embodiment of the invention. The two processor chips 12, 28 in this case are connected to only two other processor chips 30, 32 of the same printed circuit board 10, but not directly to the connectors 22 of the printed circuit board 10. Thus, communicating to processor chips 12 of other printed circuit boards 10 of the same group 14 or another group 16 of printed circuit boards 10 communication may hop over the processor chip 30 or the processor chip 32 via connections 38 to reach processor chips 12 on other printed circuit boards 10. Even only one processor chip 32 may be connected to the connectors 22 and thus to other printed circuit boards 10 as is indicated by the dashed connections 42. In this case also communication from processor chip 30 hops via processor chip 32 to reach other processor chips 12 on other printed circuit boards 10.

Figure 13:
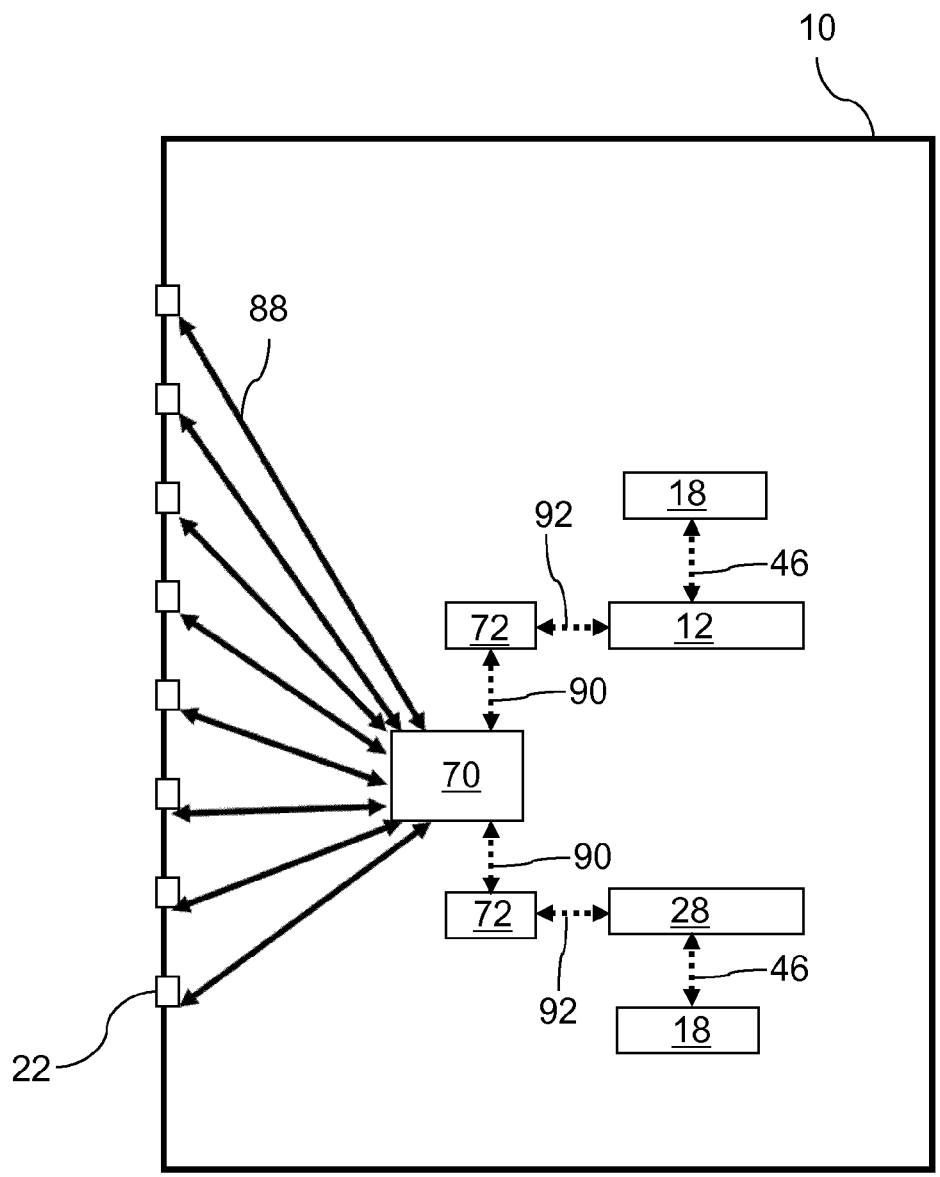
FIG. 13 is a printed circuit board with a network router and network interface controllers connected to processor chips according to a further embodiment of the invention.

FIG. 13 shows a printed circuit board 10 with a network router 70 and network interface controllers 72 connected to processor chips 12, 28 according to a further embodiment of the invention. The network router 70 is connected to the connectors 22 via connections 88 and to the network interface controllers 72 via connections 90. The processor chips 12, 28 are connected via connections 92 to the network interface controllers 72. In such an arrangement a cluster of processor chips 12, 28 may be configured on the same printed circuit board 10 wherein one or more processor chips 12, 28 are connected to the at least one network router 70 via a network interface controller 72. Such a configuration may be used on each of the printed circuit boards 10 of a multiprocessor system.

Figure 14:
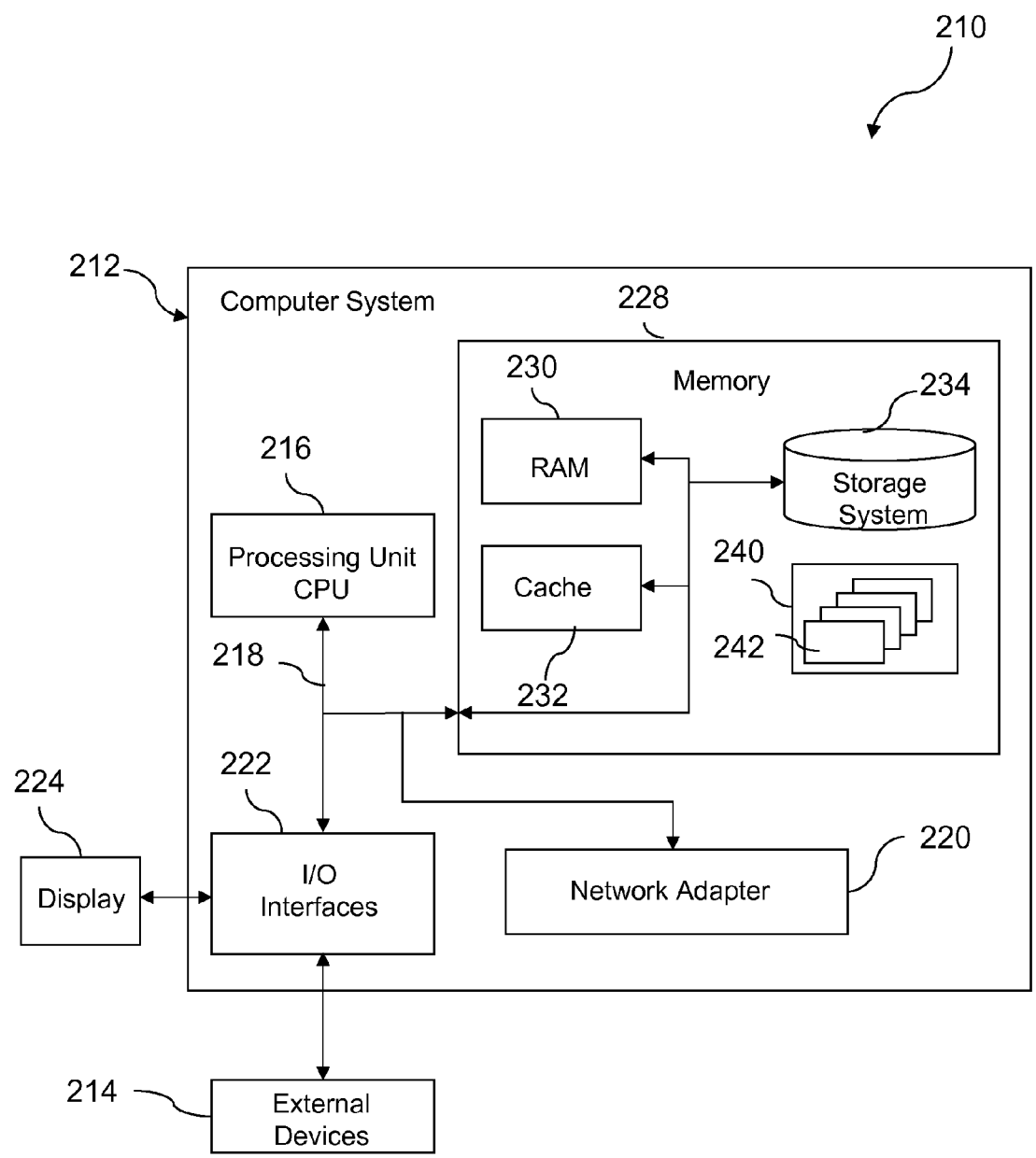
FIG. 14 is an example embodiment of a data processing system for carrying out a method according to the invention.

Referring now to FIG. 14, a schematic of an example of a data processing system 210 is shown. Data processing system 210 is only one example of a suitable data processing system and is not intended to suggest any limitation as to the scope of use or functionality of embodiments of the invention described herein. Regardless, data processing system 210 is capable of being implemented and/or performing any of the functionality set forth herein above.

The data processing system 210 is capable of running a computer program product comprising a computer usable medium including a computer readable program, wherein the computer readable program when executed on a computer system 212 causes the computer system 212 to perform a method for connecting and communicating across a plurality of printed circuit boards 10 of a computer system 212, each printed circuit board 10 comprising one or more processor chips 12, 28, 30, 32 attached to the printed circuit board 10, wherein the number of printed circuit boards 10 is an even number greater than or equal to 4, wherein the printed circuit boards 10 are arranged in two groups 14, 16, each group 14, 16 being arranged in a different stacking direction 50, 52, and wherein the one or more processor chips 12, 32 which are attached to each one of the printed circuit boards 10 of one of the groups 14, 16 are connected for communication to the processor chips 28, 30 of each printed circuit board 10 of the other group 16, 14.

In data processing system 210 there is a computer system/server 212, which is operational with numerous other general purpose or special purpose computing system environments or configurations. Examples of well-known computing systems, environments, and/or configurations that may be suitable for use with computer system/server 212 include, but are not limited to, micro-controllers, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 212 may be described in the general context of computer system executable instructions, such as program modules, being executed by a computer system. Generally, program modules may include routines, programs, objects, components, logic, data structures, and so on that perform particular tasks or implement particular abstract data types. Computer system/server 212 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 14, computer system/server 212 in data processing system 210 is shown in the form of a general-purpose computing device. The components of computer system/server 212 may include, but are not limited to, one or more processors or processing units 216, a system memory 228, and a bus 218 that couples various system components including system memory 228 to processor 216. Bus 218 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 212 typically includes a variety of computer system readable media. Such media may be any available media that is accessible by computer system/server 212, and it includes both volatile and non-volatile media, removable and non-removable media.

System memory 228 can include computer system readable media in the form of volatile memory, such as random access memory (RAM) 230 and/or cache memory 232. Computer system/server 212 may further include other removable/non-removable, volatile/non-volatile computer system storage media. By way of example only, storage system 234 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 218 by one or more data media interfaces. As will be further depicted and described below, memory 228 may include at least one program product having a set (e.g., at least one) of program modules that are configured to carry out the functions of embodiments of the invention.

Program/utility 240, having a set (at least one) of program modules 242, may be stored in memory 228 by way of example, and not limitation, as well as an operating system, one or more application programs, other program modules, and program data.

Each of the operating system, one or more application programs, other program modules, and program data or some combination thereof, may include an implementation of a networking environment. Program modules 242 generally carry out the functions and/or methodologies of embodiments of the invention as described herein.

Computer system/server 212 may also communicate with one or more external devices 214 such as a keyboard, a pointing device, a display 224, etc.; one or more devices that enable a user to interact with computer system/server 212; and/or any devices (e.g., network card, modem, etc.) that enable computer system/server 212 to communicate with one or more other computing devices. Such communication can occur via Input/Output (I/O) interfaces 222. Still yet, computer system/server 212 can communicate with one or more networks such as a local area network (LAN), a general wide area network (WAN), and/or a public network (e.g., the Internet) via network adapter 220. As depicted, network adapter 220 communicates with the other components of computer system/server 212 via bus 218. It should be understood that although not shown, other hardware and/or software components could be used in conjunction with computer system/server 212. Examples, include, but are not limited to: microcode, device drivers, redundant processing units, external disk drive arrays, RAID systems, tape drives, and data archival storage systems, etc.

The block diagrams in the figures illustrate the architecture, functionality, and operation of possible implementations of systems, methods and computer program products according to various embodiments of the present invention. In this regard, each block in the block diagrams may represent a module, segment, or portion of code, which comprises one or more executable instructions for implementing the specified logical functions. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

The invention claimed is:

1. A computer system, comprising:
a plurality of printed circuit boards, each printed circuit board comprising two or more processor chips attached to the printed circuit board and a plurality of connectors, wherein a first subset of the two or more processor chips are connected to a first subset of the plurality of connectors and wherein a second subset of the two or more processor chips are connected to a second subset of the plurality of connectors;
wherein the number of printed circuit boards is an even number greater than or equal to 4, the printed circuit boards are arranged in two groups, each group being arranged in a different stacking direction, and wherein the two or more processor chips which are attached to each one of the printed circuit boards of one of the groups are connected for communication to the processor chips of at least one printed circuit board of the other group.

2. The computer system according to claim 1, wherein the stacking directions of the two groups are arranged orthogonally.

3. The computer system according to claim 1, wherein a processor chip is connected to a memory device.

4. The computer system according to claim 1, wherein the connection of the processor chip to a corresponding memory device is performed using a memory subsystem.

5. The computer system according to claim 1, wherein the printed circuit board of one of the groups is connected to each of the printed circuit boards of the other group via at least one connector of a plug type or a socket type or a one combined plug and socket type.

6. The computer system according to claim 1, wherein the one or more processor chips on at least one of the printed circuit boards is connected to the at least one connector on the same printed circuit board and, if more than one processor chip is on the printed circuit board, to all other processor chips on the same printed circuit board.

7. The computer system according to claim 1, wherein at least one processor chip on at least one of the printed circuit boards of one of the groups comprises a network interface.

8. The computer system according to claim 1, wherein the one or more processor chips which are attached to one of the printed circuit boards of one of the groups are connected to each of the processor chips of all printed circuit boards of the other group via at least one network router and a network interface controller.

9. The computer system according to claim 1, wherein at least one processor chip on a printed circuit board of one of the groups is connected to a PCI Express card providing access to the PCI Express card for at least one processor chip on another printed circuit board of the same group or another group.

10. A computer readable storage medium having computer readable instructions stored thereon that, when executed by a computer, implement a method for connecting and communicating across a plurality of printed circuit boards of a computer system, each printed circuit board comprising two or more processor chips attached to the printed circuit board and a plurality of connectors, wherein a first subset of the two or more processor chips are connected to a first subset of the plurality of connectors and wherein a second subset of the two or more processor chips are connected to a second subset of the plurality of connectors, wherein the number of printed circuit boards is an even number greater than or equal to 4, the method comprising:
arranging the printed circuit boards in two groups, each group being arranged in a different stacking direction; and
connecting the two or more processor chips, which are attached to each one of the printed circuit boards of one of the groups, for communication to the processor chips of at least one printed circuit board of the other group.

11. The storage medium according to claim 10, wherein the communication across the processor chips is performed via at least one of:
a coherent shared memory access;
a non-coherent shared memory access;
providing access to a graphics, storage, communication or other adapter card attached via a PCI-interface;
message passing using a network protocol;
using communication between two or more processor chips on the same printed circuit board; and
at least one network router and a network interface controller connected to at least one processor chip on at least one printed circuit board.

12. The storage medium according to claim 10, wherein a printed circuit board is unconnected by previously idling its one or more processor chip via a hypervisor running on the computer system.

13. The storage medium according to claim 10, wherein the communication is tracked by a precise directory.

* * * * *